United States Patent
Kitano et al.

(10) Patent No.: US 8,012,822 B2
(45) Date of Patent: Sep. 6, 2011

(54) PROCESS FOR FORMING DIELECTRIC FILMS

(75) Inventors: Naomu Kitano, Machida (JP); Yusuke Fukuchi, Yokohama (JP); Nobumasa Suzuki, Yokohama (JP); Hideo Kitagawa, Tottori (JP)

(73) Assignees: Canon Kabushiki Kaisha, Tokyo (JP); Canon Anelva Corporation, Kawasaki-shi (JP)

( * ) Notice: Subject to any disclaimer, the term of this patent is extended or adjusted under 35 U.S.C. 154(b) by 161 days.

(21) Appl. No.: 12/342,360

(22) Filed: Dec. 23, 2008

(65) Prior Publication Data
US 2009/0170341 A1    Jul. 2, 2009

(30) Foreign Application Priority Data

Dec. 27, 2007  (JP) ................................. 2007-336732
Dec. 27, 2007  (JP) ................................. 2007-336733

(51) Int. Cl.
  *H01L 29/72*    (2006.01)
(52) U.S. Cl. ........ 438/216; 438/261; 438/763; 438/785; 257/E21.625
(58) Field of Classification Search .................. 438/216, 438/261, 591, 762, 763, 785; 257/E21.625
See application file for complete search history.

(56) References Cited

U.S. PATENT DOCUMENTS

| 6,734,069 | B2 | 5/2004 | Eriguchi ................. 438/287 |
| 7,105,362 | B2 | 9/2006 | Takahashi et al. ........... 438/3 |
| 2003/0092238 | A1 | 5/2003 | Eriguchi ................. 438/287 |
| 2003/0185980 | A1 | 10/2003 | Endo .................. 427/255.23 |
| 2005/0282341 | A1 | 12/2005 | Park et al. |
| 2006/0003603 | A1 | 1/2006 | Fukuchi ................. 438/787 |
| 2006/0008969 | A1 | 1/2006 | Takahashi et al. ......... 438/216 |
| 2006/0194396 | A1* | 8/2006 | Sunil et al. .............. 438/287 |

FOREIGN PATENT DOCUMENTS

| JP | 2002-314074 | 10/2002 |
| JP | 2003-297814 | 10/2003 |
| JP | 2004-140292 | 5/2004 |

OTHER PUBLICATIONS

Chinese Office Action issued in the counterpart Application No. 200810190696.3 dated Dec. 11, 2009 (English language translation included)—9 pages.

* cited by examiner

*Primary Examiner* — Thanhha Pham
(74) *Attorney, Agent, or Firm* — Fitzpatrick, Cella, Harper & Scinto (57) ABSTRACT

A process for forming dielectric films containing at least metal atoms, silicon atoms, and oxygen atoms on a silicon substrate comprises a first step of oxidizing a surface portion of the silicon substrate to form a silicon dioxide film; a second step of forming a metal film on the silicon dioxide film in a non-oxidizing atmosphere; a third step of heating in a non-oxidizing atmosphere to diffuse the metal atoms constituting the metal film into the silicon dioxide film; and a fourth step of oxidizing the silicon dioxide film containing the diffused metal atoms to form the film containing the metal atoms, silicon atoms, and oxygen atoms.

8 Claims, 10 Drawing Sheets

PROCESS FOR FORMING DIELECTRIC FILMS

BACKGROUND OF THE INVENTION

1. Field of the Invention

The present invention relates to a process for forming dielectric films, particularly to a process for forming dielectric films suitable for use as high permittivity gate dielectric films in a semiconductor device.

2. Description of the Related Art

In semiconductor devices like MOS (metal oxide semiconductor) type transistors, channel lengths are made shorter and shorter to increase the operation speed. However, the shortening of the channel length lowers the capacitance of the gate dielectric films and retards the switching operation of the transistors. Therefore to obtain a sufficient capacitance for the switching operation of the transistors, the gate dielectric films are made thinner. Conventionally as the material for the dielectric films of MOS type transistors, silicon dioxide ($SiO_2$) is used owing to ease of the production and the resulting satisfactory interfacial properties of the film. However, the decrease of the thickness of the gate dielectric films to several nanometers tends to cause a larger amount of gate leakage current to increase the power consumption disadvantageously. One solution to this problem is formation of the gate dielectric films from a material having a relative permittivity constant higher than that of $SiO_2$ ($\epsilon_r$=3.9). The dielectric films composed of such a material are called high permittivity dielectric films (high-k dielectric films). The high-k dielectric films having a higher permittivity constant can be made thicker for obtaining the capacitance comparative to that of the silicon dioxide film without the increase of the leakage current.

The material for the high-k dielectric films include metal dioxide such as $ZrO_2$ and $HfO_2$. A known method for depositing such a metal dioxide on a surface of a substrate is organometal chemical vapor deposition (MOCVD) as described in Japanese Patent Application Laid-Open No. 2004-140292 (US counterpart U.S. Pat. No. 7,105,362, US Application Publication No. 2006/0008969). In the MOCVD, a metal complex material is liquefied by heating in a vessel, vaporized by introducing a carrier gas into the vessel, and carried to a reaction chamber. The material carried to the reaction chamber deposits to form a film on the surface of a heated substrate.

However, the film formed by MOCVD contains a large amount of residual impurities like carbon and hydrogen coming from the starting organic material. The residual impurities tend to cause a large quantity of a leakage current in the formed film. Another known method is sputtering which enables deposition of a metal oxide containing a less amount of impurities unlike the MOCVD. In sputtering, high-energetic particles are allowed to collide against a surface of a metal target to repel the target-constituting atoms and to deposit the atoms on the surface. For example, an inert rare gas like argon is ionized by electric discharge by use of a target metal as a cathode and the formed ions are allowed to collide against the target metals to cause sputtering. Thereby a metal film containing less residual impurities can be deposited.

A conventional process for forming high-k dielectric films by sputtering is described below with reference to FIGS. 4A to 4D. In FIGS. 4A to 4D, the numerals denote followings: 401, a substrate composed of monocrystalline silicon or a like material; 402, a silicon dioxide film; 403, a metal film; 404, a metal silicate film; 405, a metal dioxide film.

Figure 4A:
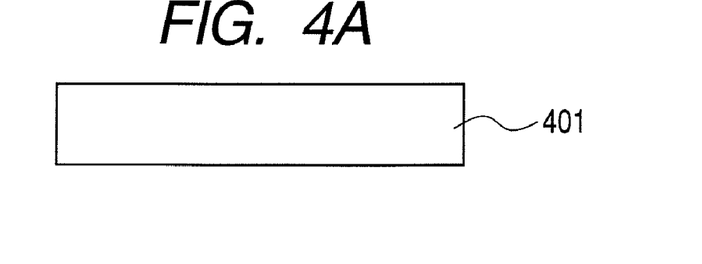
FIGS. 4A, 4B, 4C, and 4D are sectional views illustrating a conventional process of producing high-permittivity dielectric films.
Figure 4B:
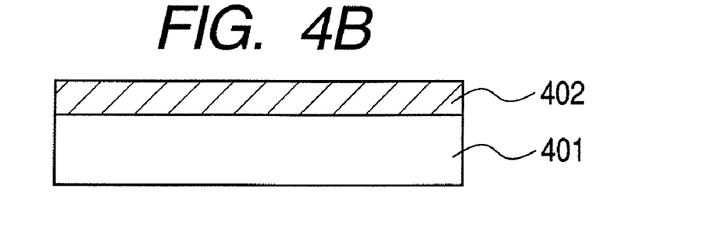

In the step of FIG. 4A, the surface of substrate 401 is cleaned by RCA cleaning or a like cleaning method to eliminate contaminants from the surface to expose silicon atoms on the surface. Then, in the step of FIG. 4B, the surface portion of substrate 401 is oxidized to form silicon dioxide film 402. The oxidation of the surface portion of substrate 401 is conducted by thermal oxidation, radical oxidation, or a like method. In the next step shown in FIG. 4C, metal film 403 is deposited by sputtering on the surface of silicon dioxide film 402. In the next step shown in FIG. 4D, metal film 403 is oxidized by oxygen radicals to form a metal dioxide film 405. Since a crystallized metal dioxide film tends to cause leakage current in comparison with an amorphous metal dioxide film, the oxidation of metal film 403 is conducted with oxygen radicals, which enables oxidation at a lower temperature without crystallization during the oxidation. The oxygen radicals are generated by plasma excitation, photo-excitation, or a like method.

Figure 4C:
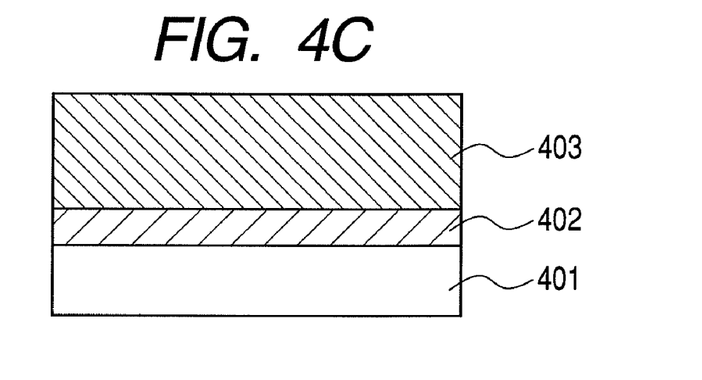
Figure 4D:
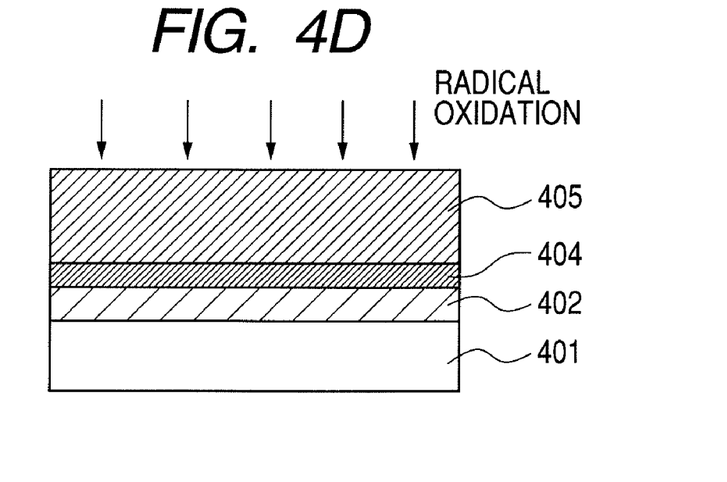

During the radical oxidation, a portion of the metal atoms constituting metal film 403 diffuses into silicon dioxide film 402 to form metal silicate film 404. Metal silicate film 404 is thermally more stable and less liable to crystallize than metal dioxide film 405.

Therefore, in order to obtain gate dielectric films having excellent thermal stability and reliability, preferably the mixing of metal film 403 and the silicon dioxide film is promoted to convert the metal dioxide in the film to silicate as much as possible.

On the other hand, Japanese Patent Application Laid-Open No. 2002-314074 (US counterpart U.S. Pat. No. 6,734,069□ US Application Publication No. 2003/0092238) discloses thermal oxidation at a high temperature for promoting diffusion of metal atoms. Japanese Patent Application Laid-Open No. 2003-297814 (US counterpart US Application Publication No. 2003/0185980) discloses irradiation of energetic particles for promoting diffusion of metal atoms.

In the above method of Japanese Patent Application Laid-Open No. 2004-140292, metal film 403 is oxidized at a low temperature, so that the metal atoms do not diffuse well. A longer time of oxidation by this method to diffuse the metal atoms enough into the silicon dioxide film can cause excessive oxidation. On the other hand, in the method of Japanese Patent Application Laid-Open No. 2002-314074, in which thermal oxidation is conducted at a high temperature to diffuse the metal atoms in a short time, the underlying silicon substrate tends to be oxidized to increase excessively the thickness of the silicon dioxide film.

In the method of Japanese Patent Application Laid-Open No. 2003-297814, in which the metal atoms are diffused only by irradiation of energetic particles, the thickness of the remaining silicon dioxide film cannot readily be controlled.

As described above, in conventional techniques, the diffusion of the metal into the silicon dioxide film and the mixing of the silicon dioxide film with the metal film cannot readily be controlled, and the conditions of diffusion of the metal atoms and the conditions of the oxidation of metal film cannot be controlled independently. Thus conventional techniques cannot produce dielectric films having a desired film thickness with a high productivity. Measures to solve the problems are demanded.

SUMMARY OF THE INVENTION

To solve the above technical problems, the present invention intend to produce high permittivity dielectric films with a precise controllability and at a high productivity.

The present invention is directed to a process for forming a dielectric film containing at least metal atoms, silicon atoms, and oxygen atoms on a silicon substrate, the process comprising: a first step of oxidizing a surface portion of the silicon substrate to form a silicon dioxide film; a second step of forming a metal film on the silicon dioxide film in a non-oxidizing atmosphere; a third step of heating in a non-oxidizing atmosphere to diffuse the metal atoms constituting the metal film into the silicon dioxide film; and a fourth step of oxidizing the silicon dioxide film containing the diffused metal atoms to form the film containing the metal atoms, silicon atoms, and oxygen atoms.

The heating in the third step can be conducted at a lower temperature at which crystallization will not occur in a metal silicate film formed by reaction of metal atoms constituting the metal film, and the oxygen atoms and silicon atoms constituting the silicon dioxide film.

The heating in the third step can be conducted at a selected temperature for a selected time not to cause penetration of the metal diffusing in the silicon dioxide film to reach the silicon substrate.

The silicon substrate with the metal film and the silicon dioxide film can be kept in a non-oxidizing atmosphere between completion of the second step and start of the third step.

The second step can be conducted by sputtering.

The oxidation in the fourth step can be conducted by radical oxidation.

The process comprises, after the fourth step, additionally a fifth step in which the film containing the metal atoms, silicon atoms, and oxygen atoms can be nitrided to form a metal nitride silicate film.

The plasma containing at least nitrogen atoms can be used as the means for nitriding the film in the fifth step.

The present invention is directed to a process for forming a dielectric film containing at least metal atoms, silicon atoms, and oxygen atoms on a silicon substrate, the process comprising: a first step of oxidizing a surface portion of the silicon substrate to form a silicon dioxide film; a second step of forming a metal film on the silicon dioxide film in a non-oxidizing atmosphere; a third step of exposing the metal film to rare gas plasma in a non-oxidizing atmosphere to diffuse the metal atoms constituting the metal film into the silicon dioxide film; and a fourth step of oxidizing the silicon dioxide film containing the diffused metal atoms to form the film containing the metal atoms, silicon atoms, and oxygen atoms.

In the process for forming a dielectric film, after the first step, the second step and the third step can be repeated alternately plural times, and thereafter the fourth step can be conducted.

The oxidation in the fourth step can be conducted by radical oxidation.

The rare gas plasma can contain at least a rare gas having an atomic weight closest to the metal atom constituting the metal film.

The metal film can contain at least Zr, and the rare gas contains at least Kr.

The metal film contains at least Hf, and the rare gas can contain at least Xe.

The process comprises, after the fourth step, additionally a fifth step in which the film containing the metal atoms, silicon atoms, and oxygen atoms can be nitrided to form a metal nitride silicate film.

The plasma containing at least nitrogen atoms can be used as the means for nitriding the film in the fifth step.

The present invention is directed to a process for forming a dielectric film containing at least metal atoms, silicon atoms, and oxygen atoms on a silicon substrate, the process comprising: a first step of oxidizing a surface portion of the silicon substrate to form a silicon dioxide film; a second step of forming a metal film on the silicon dioxide film in a non-oxidizing atmosphere; a third step of exposing the metal film to plasma containing an oxidizing gas and a rare gas to oxidize the metal film and to diffuse the metal atoms constituting the metal film into the silicon dioxide film.

In the process for forming a dielectric film, distribution of the metal atoms in depth direction in the film containing metal atoms, silicon atoms, and oxygen atoms can be controlled by changing a mixing ratio of the oxidizing gas and the rare gas.

The rare gas can contain at least a rare gas atom having an atomic weight closest to the metal atom constituting the metal film.

The metal film contains at least Zr, and the rare gas can contain at least Kr.

The metal film contains at least Hf, and the rare gas can contain at least Xe.

The process can comprise, after the third step, additionally a fourth step in which the film containing the metal atoms, silicon atoms, and oxygen atoms can be nitrided to form a metal nitride silicate film.

The plasma containing at least nitrogen atoms can be used as the means for nitriding the film.

According to the present invention, high permittivity dielectric films suitable for use as a high permittivity gate dielectric films can be formed with precise controllability and high productivity.

Further features of the present invention will become apparent from the following description of exemplary embodiments with reference to the attached drawings.

DESCRIPTION OF THE EMBODIMENTS

Preferred embodiments of the present three inventions will now be described in detail in accordance with the accompanying drawings.

(First Invention)

An embodiment of the process for forming dielectric films according to the present first invention is described in detail with reference to FIGS. 1A to 1E.

In FIGS. 1A to 1E, the numerals denote the followings: 101, a silicon substrate (occasionally called simply as a "substrate"); 102, a silicon dioxide film; 103, a metal film; 104, a metal silicate film; 105, a metal dioxide film.

Figure 1A:
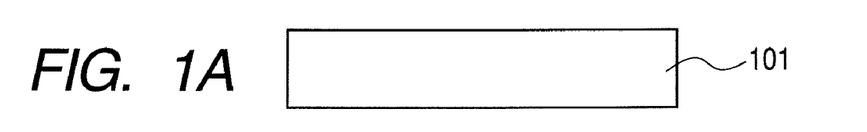
FIGS. 1A, 1B, 1C, 1D, and 1E are sectional views illustrating an embodiment of production of an insulating film according to the present first invention.

Substrate 101 is composed of a monocrystalline silicon having, for example, (100)-face orientation and doped with phosphorus, and having a controlled resistance ranging from 2 to 10 $\Omega \cdot cm$. In the present invention, the silicon substrate may be different from the above in the face orientation, the dopant, and the resistance. Otherwise, substrate 101 may be composed of a material other than silicon and thereon silicon is grown by epitaxy.

Firstly, in FIG. 1A, the surface of the substrate is cleaned by an RCA or a like cleaning method to eliminate a metal, an organic matter, particles, a native oxide film, and the like to bare clean silicon atoms on the surface.

Figure 1B:
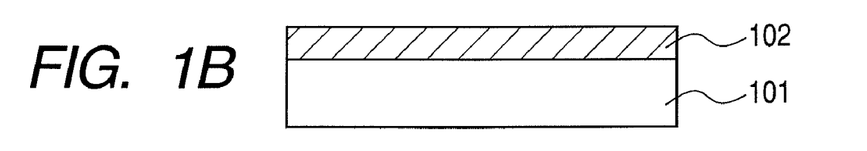

Then in the first step as illustrated in FIG. 1B, the surface portion of silicon substrate 101 is oxidized to form silicon dioxide film 102. Silicon dioxide film 102 is formed firstly on the surface of the silicon substrate 101 because formation of a metal dioxide film directly on the silicon substrate cannot give satisfactory interface properties. Silicon dioxide film 102 is formed in a thickness ranging from 0.5 nm to 2 nm, because silicon dioxide film 102 having an excessive thickness cannot give a sufficiently low oxide-equivalent thickness. The method of oxidation of the surface portion of substrate 101 includes thermal oxidation, radical oxidation, and the like for forming a satisfactory silicon interface. For the thermal oxidation, a hot-wall thermal oxidation furnace, or an infrared high-speed thermal oxidation apparatus is useful. In oxidation by a thermal oxidation furnace, the oxidation may be conducted by dry oxidation, or wet oxidation. In the wet oxidation, the oxidation is conducted by oxygen gas with a carrier gas like argon or nitrogen introduced through pure water. Otherwise, the oxidation may be conducted by a burning oxidation (pyrogenic method) employing oxygen gas and hydrogen gas. The gas used for the oxidation includes, in addition to the above-mentioned gases, $O_3$, $H_2O$, $NO$, $N_2O$, and $NO_2$.

Figure 1C:
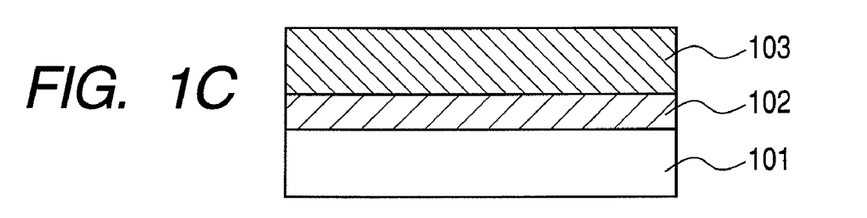

In the second step, as illustrated in FIG. 1C, metal film 103 is formed on silicon dioxide film 102 by depositing a metal by sputtering in a non-oxidizing atmosphere in which the metal atoms are not oxidized. The non-oxidizing atmosphere can be provided, for example, by evacuating the sputtering treatment chamber to a high vacuum to remove completely oxygen, water, and so forth before the sputtering to prevent oxidation of metal film 103. Otherwise, the atmosphere of the treatment chamber may be substituted sufficiently with a rare gas. The sputtering may be conducted by any type of sputtering process, such as ECR sputtering, DC magnetron sputtering, and RF magnetron sputtering. The metal to be deposited by the sputtering includes Al, Sr, Ba, Sc, Y, Ti, Zr, Hf, Ta, and lanthanide type metals such as La and Ce. Such a metal element can form an oxide having a permittivity constant higher than that of silicon dioxide. The metal to be deposited may be a single metal element or composed of plural metals. The metal layer may be a lamination of different metal films. In sputtering, high-energetic particles are allowed to collide against a surface of a metal target and to repel the target-constituting atoms to deposit on the surface of the substrate. For example, in the sputtering, an inert rare gas like argon is ionized by electric discharge by use of a target metal as a cathode and the formed ions are allowed to collide against the target metals. In another sputtering method, reactive sputtering, a reactive gas is added to the rare gas to cause deposition of a compound formed from the reactive gas and the target metal atoms. For example, by use of an oxidizing gas like $O_2$ as the reactive gas, the metal atoms are oxidized to deposit a metal dioxide. In contrast in the present invention, without addition of such an oxidizing reactive gas, the target metal is sputtered in an atmosphere in which the metal atoms are not oxidized (in non-oxidizing atmosphere). Therefore, metal film 103 is formed on silicon dioxide film 102 without oxidation of the sputtered metal atoms. The non-oxidizing atmosphere in this second step is preferably constituted of at least one of the rare gases of He, Ne, Ar, Kr, and Xe. The oxygen partial pressure in the non-oxidizing atmosphere in this second step is preferably not higher than $1 \times 10^{-5}$ Pa.

Figure 1D:
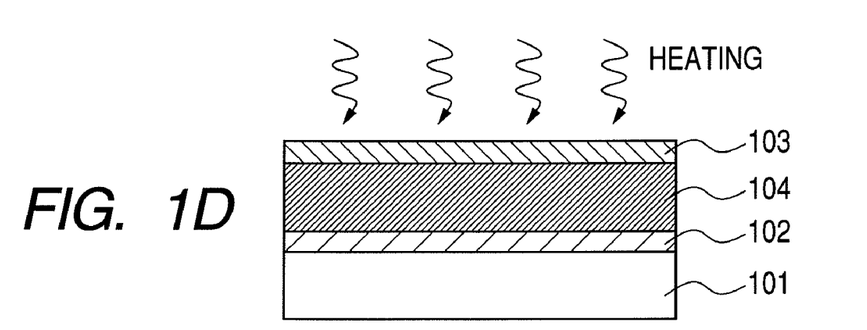

In the third step, as illustrated in FIG. 1D, substrate 101 having metal film 103 and silicon dioxide film 102 is heated to diffuse the metal atoms of metal film 103 into silicon dioxide film 102. The heat treatment includes, for example, heating at an atmospheric pressure in an electric heating furnace, and heating by an infrared lamp. In heating in a heat-treatment apparatus, substrate 101 is heated preferably in a heating chamber filled with an inert gas such as a rare gas not to cause oxidation of metal film 103 deposited on substrate 101. In another method of heating without causing oxidation of metal film 103, substrate 101 is heat-treated in a high vacuum in a heating chamber. The heating means for heating the substrate in a high vacuum includes a heat-conducting means incorporated in a substrate-supporting means, and a radiation heating means by an infrared lamp.

In the third step of the present invention, the non-oxidizing atmosphere signifies an atmosphere in which metal film 103 is not oxidized. The non-oxidizing atmosphere in this third step is preferably constituted of at least one of the rare gases of He, Ne, Ar, Kr, and Xe, and $N_2$. The oxygen partial pressure in the non-oxidizing atmosphere in this second step is preferably not higher than $1 \times 10^{-5}$ Pa.

In the above heat treatment, the metal atoms in metal film 103 diffuse into silicon dioxide film 102. Thereby, silicon dioxide film 102 and metal film 103 come to be mixed together to form metal silicate film 104. By the heat treatment at a high temperature, more metal atoms are diffused quickly deep into silicon dioxide film 102 in comparison with the metal atom diffusion by conventional radical oxidation at a low temperature. The concentration distribution of the metal atoms diffused in the silicon dioxide film can be controlled by conditions of the temperature, time, and so forth of heating of substrate 101. The diffusion of the metal atoms like Hf atoms is preferably controlled to be within the silicon dioxide film. That is, in the heating in the third step, the temperature and time of heating are adjusted not to cause penetration of the diffused metal atoms through silicon dioxide film 102 to silicon substrate 101. The metal atoms like Hf atoms, which have penetrated through silicon dioxide film 102 to reach the interface to the underlying silicon substrate, can cause deterioration of the interface characteristics.

In the present invention, metal film 103 is deposited by sputtering in an atmosphere in which the metal atoms are not oxidized, and further the deposited metal film 103 is heat-treated in an atmosphere in which deposited metal film 103 is not oxidized, whereby the metal is not oxidized. Therefore even if substrate 101 is heated in the heat treatment step at a high temperature at which the metal dioxide can crystallize, the metal does not crystallize. That is, the heating in the third step is conducted below the temperature at which crystallization occurs in metal silicate film 104 formed by reaction of metal atoms of metal film 103 with oxygen atoms and silicon atoms of silicon dioxide film 102. For example, in the case of HfSiO$_x$, the heating temperature ranges from 300° C. to 700° C. Further, the metal silicate formed by reaction of the metal diffused in the silicon dioxide film is less liable to crystallize in heat treatment at a high temperature in comparison with the metal dioxide film. For example, an oxide of Hf, HfO$_2$, comes to crystallize at about 600° C. On the other hand, when the substrate is heated with Hf deposited without oxidation as in the present invention, the metal silicate film formed by diffusion of the metal atoms into the silicon dioxide film will not crystallize by heat treatment at a high temperature of about 700° C. As described above, the silicon dioxide film and the metal film can be mixed by heat treatment at a high temperature at which the crystallization cannot be prevented in conventional techniques.

Between completion of the sputtering and start of the heat treatment, the substrate is kept in a non-oxidizing atmosphere to prevent oxidation of metal film 103 formed by the sputtering. More specifically, between the second step and the third step, silicon substrate 101 with metal film 103 and silicon dioxide film 102 is held in an inert atmosphere in which the metal atoms constituting the metal film 103 will not be oxidized.

For example, preferably the sputtering equipment and the heat treatment equipment are joined together directly or through a load-lock chamber kept at a high vacuum to transfer the substrate by a substrate-transferring means without oxidation of the metal film. Or the sputtering and the heat treatment are preferably conducted in the same equipment. Otherwise, when the substrate is taken out of the equipment after the sputtering, the substrate is transferred through a transfer path filled with an inert gas like a rare gas or nitrogen. The method of the handling of the substrate is not limited thereto insofar as the metal film is not oxidized.

In this embodiment, a part of metal film 103 remains unmixed after the heat treatment. However, metal film 103 may be mixed completely with silicon film 102 without leaving metal film 103 unmixed.

Figure 1E:
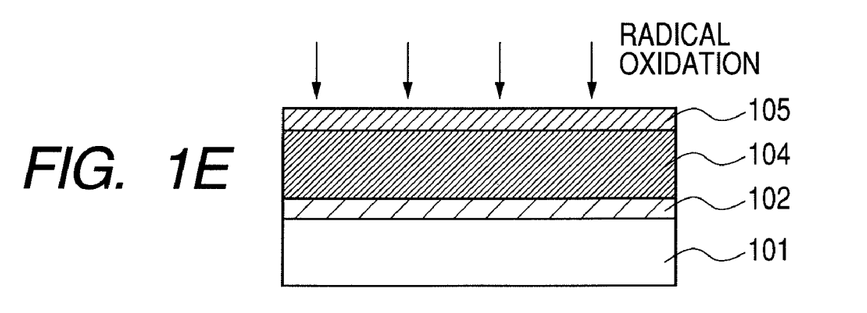

In the fourth step, as illustrated in FIG. 1E, the silicon dioxide film containing the diffused metal atoms (metal silicate film 104) is oxidized to form a film containing the metal atoms, silicon atoms, and oxygen atoms. This fourth step is preferably a low-temperature oxidation process, such as radical oxidation. The oxidation in this fourth step is conducted at a temperature, for example, in the range from 200° C. to 400° C. Metal silicate film 104 formed in the heat-treatment in FIG. 1D do not contain sufficient oxygen in composition as dielectric films. Therefore the film is radical-oxidized to obtain a highly insulating metal silicate film. When a portion of metal film 103 remains unmixed with silicon dioxide film 102, the remaining metal film is oxidized similarly to become insulating. The radical oxidation method enables oxidation of the metal film by keeping the high quality at lower temperature than a thermal oxidation method, being suitable for the oxidation treatment of metal film 103. The oxygen radicals for the radical oxidation can be generated by any method including a plasma exciting means, and optical exciting means. With the plasma exciting means, any plasma source may be employed including ICP, helicon, ECR, microwaves, and surface waves, insofar as the plasma does not damage the dielectric film. With the optical exciting means, any light source is applicable which is capable of irradiating the light of wavelength for exciting the oxidizing gas to produce oxygen radicals, including a Xe excimer lamp.

The oxidizing gas used for the oxidation includes $O_2$, $O_3$, $H_2O$, NO, $N_2O$, and $NO_2$, mixtures thereof, and the oxidizing gas diluted with $H_2$, $N_2$, He, Ne, Ar, Kr, and Xe.

If necessary, after the fourth step, a fifth step may be conducted in which metal silicate film 104, i.e., a film containing metal atoms, silicon atoms, and oxygen atoms, is nitrided to form a metal nitride silicate film. This nitridation treatment can make higher the permittivity constant, increase the thermal stability to prevent crystallization of the metal dioxide film, and prevent diffusion of an impurity from the upper electrode formed later. In the fifth step, the nitriding means employs preferably plasma containing at least nitrogen atoms. In other words, the nitridation is conducted preferably by plasma capable of nitriding the metal silicate film and the metal dioxide film at a low temperature.

The gas applicable to the nitridation includes $N_2$, $NH_3$, $N_2H_4$, and hexamethyldisilazane (HMDS). For quick ignition of the plasma, a rare gas such as He, Ne, Ar, Kr, and Xe may be added thereto at least at the time of ignition.

The nitridation treatment converts metal silicate film 104 to a metal nitride silicate, and metal dioxide film 105 to a metal oxy-nitride film.

As described above, the step of diffusion of the metal atoms and the step of oxidation of the metal film are conducted separately. Thereby, the conditions of diffusion of the metal atoms and the conditions of oxidation of the metal film can be controlled independently, and the metal atoms can be diffused in a short time by high-temperature-heating. Thus a high permittivity dielectric films suitable as high-permittivity gate dielectric films can be formed with precise controllability and high productivity.

The process of formation of the dielectric films of the present first invention is described below with reference to examples below without limiting the invention.

EXAMPLE 1-1

The process of this Example was conducted as illustrated in FIGS. 1A to 1E. Silicon substrate 101 was a p-type monocrystalline silicon substrate of 200 mm diameter.

Firstly, the surface of substrate 101 was cleaned by RCA cleaning to eliminate impurities and a native oxide film.

Next, substrate 101 was transferred to a high-speed thermal oxidation equipment and was thermally oxidized in an oxygen atmosphere at 1000° C. to form silicon dioxide film 102 of 2 nm thick on the surface layer of substrate 101.

Subsequently, substrate 101 having silicon dioxide film 102 was transferred into an RF magnetron type sputtering equipment not shown in the drawing. The target of the sputtering equipment was constituted of Hf. The sputtering equipment holding the substrate inside was evacuated to a vacuum of $2.6 \times 10^{-3}$ Pa. Substrate 101 was heated by a heating means and was kept at 300° C. Thus oxygen and moisture which can oxidize the metal film in the deposition of the metal film was eliminated out of the sputtering equipment. Then Ar gas was introduced into the sputtering equipment at a rate of 5 sccm, and the inside pressure of the sputtering equipment was kept at 0.2 Pa. Then a high frequency wave of 250 W was applied to the target to generate plasma to sputter the Hf atoms of the target. The sputtered Hf atoms flied to substrate 101 opposing to the target and deposited on silicon oxide film 102 to form metal film 103. By this treatment, metal film 103 composed of Hf was formed in a thickness of 5 nm on silicon dioxide film 102. During the metal film formation, the oxygen pressure was kept in the range from $1 \times 10^{-7}$ to $10^{-8}$ Pa.

Thereafter the high frequency application and the Ar gas feed were stopped, and the inside of the sputtering equipment was evacuated. Then substrate 101 was heated at 700° C. at an oxygen partial pressure of $1\times10^{-7}$ to $10^{-8}$ Pa. Therefore, metal film 103 was not oxidized by the atmosphere in the equipment. In this step the Hf atoms constituting metal film 103 diffuse into silicon dioxide film 102 and mixed therewith to form metal silicate film 104 constituted of the Hf silicate.

In the next step, for radical oxidation of metal film 103 and metal silicate film 104, the substrate was transferred into a plasma equipment (not shown in the drawings) which generates oxygen radicals by surface-wave plasma. The plasma equipment was evacuated, and $O_2$ gas was introduced into the plasma equipment at a flow rate of 1000 sccm. The pressure inside the plasma equipment was kept at 400 Pa. In this step, the temperature of substrate 101 was kept at 200° C. by a heater incorporated in a substrate-supporting stage. A microwave of 2.45 GHz was emitted from an antenna and was introduced into the plasma equipment through a dielectric wall for keeping the vacuum to generate surface-wave plasma. With this excited oxygen radicals, oxygen-lacking silicate film 104 and metal film 103 were oxidized for 20 seconds. Thereby oxygen-lacking silicate film 104 was completely oxidized to become an insulating film, and metal film 103 remaining unsilicated were also oxidized to become dielectric films. Thereby metal dioxide film 105 was formed.

For evaluation of the thermal stability of the dielectric films, a test sample piece was prepared by heating substrate 101 having films 102, 104, and 105 at a temperature of 800° C. for 60 seconds. This test sample piece was evaluated by X-ray diffraction (XRD) measurement.

For comparison, a comparative sample was prepared in the same manner as the above test sample piece except that the substrate was not heat-treated after deposition of metal film 103. The comparative test sample piece was also subjected to X-ray diffraction (XRD) measurement.

Figure 2:
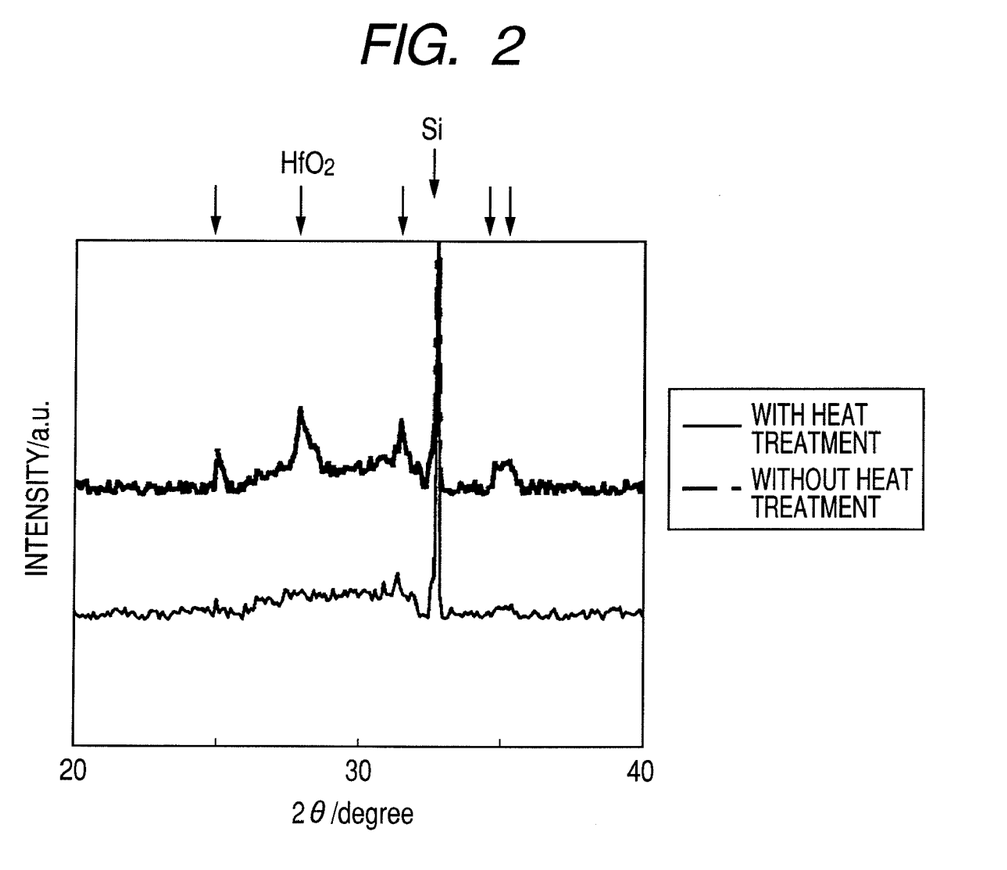
FIG. 2 shows measurement results of X-ray diffraction intensity of dielectric films of the first invention and a conventional dielectric films.

FIG. 2 shows the results. The comparative sample piece gives signal caused by $HfO_2$ crystal, whereas the sample piece prepared by the present invention gives an extremely low intensity of the signal. This is considered to be due to the improved thermal stability and inhibition of crystallization resulting from silicate formation by the heat treatment of the substrate after deposition of metal film 103.

EXAMPLE 1-2

The process of this Example was conducted as illustrated in FIGS. 1A to 1E. Silicon substrate 101 used was a p-type monocrystalline silicon substrate of 200 mm diameter.

The substrate was treated through the steps to the radical oxidation in the same manner as in Example 1-1.

In the next step of nitridation, substrate 101 having films 102, 104, 105 was transferred into a plasma equipment which generates nitrogen radicals by surface-wave plasma.

The plasma equipment was evacuated, and $N_2$ gas was introduced into the plasma equipment at a flow rate of 200 sccm. The pressure inside the plasma equipment was kept at 26 Pa. In this step, the temperature of substrate 101 was kept at 200° C. by heater incorporated in a substrate-supporting stage for heating the substrate. A microwave of 2.45 GHz was emitted from an antenna and was introduced into the plasma equipment through a dielectric wall for keeping the vacuum in the equipment to generate surface-wave plasma. With this excited nitrogen radicals, metal silicate film 104 and metal dioxide film 105 were nitrided for 30 seconds. Thereby silicate film 104 was converted to a metal nitride silicate film, and metal dioxide film 105 was converted to a metal oxy-nitride film.

For evaluation of the thermal stability of the formed dielectric film, a test sample piece was prepared by heating substrate 101 having silicon dioxide film 102, a metal nitride silicate film, and a metal oxy-nitride film at a temperature of 900° C. for 30 seconds. This test sample piece was evaluated by X-ray diffraction (XRD) measurement.

As the result, the signal of a $HfO_2$ crystal was not observed, which shows that the dielectric film keeps the amorphous state without crystallizing even by exposure to a temperature as high as 900° C.

EXAMPLE 1-3

The process of this Example was conducted according to the embodiment illustrated in FIGS. 1A to 1E. Silicon substrate used was a P-type monocrystalline silicon substrate of 200 mm diameter.

In this Example, silicon dioxide film 102 in the surface layer of substrate 101 had a thickness of 1.6 nm, and metal film 103 was formed by sputtering in a thickness of 1 nm. After the formation of the films, the substrate having the films was treated through the steps to the radical oxidation to prepare a sample in the same manner as in Example 1-1 except that the temperature and time of the heat treatment after formation of the metal film were changed as shown in Table 1 below.

TABLE 1

| Conditions | Heating temperature | Heating time |
|---|---|---|
| 1 | 600° C. | 60 seconds |
| 2 | 700° C. | 60 seconds |
| 3 | 600° C. | 120 seconds |

Figure 3A:
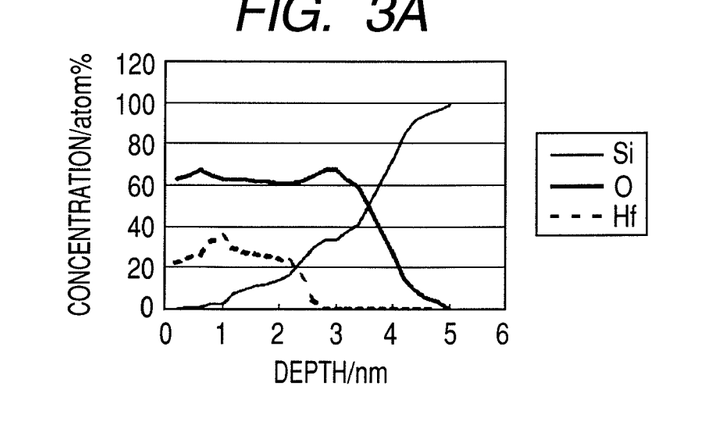
FIGS. 3A, 3B, and 3C show distributions in the depth direction of elements constituting the dielectric films formed under different conditions of heating the metal film.
Figure 3B:
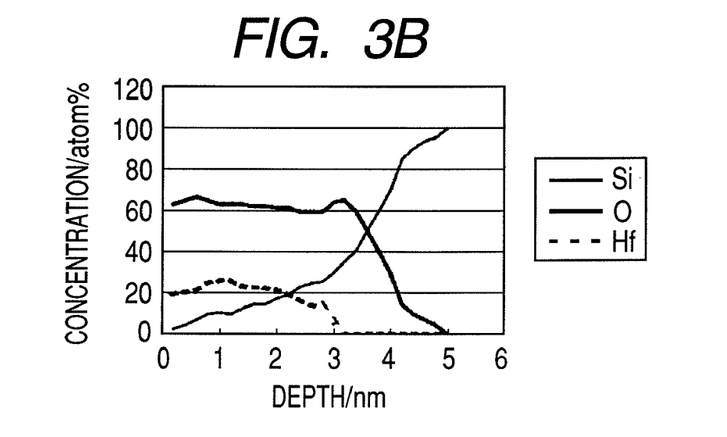
Figure 3C:
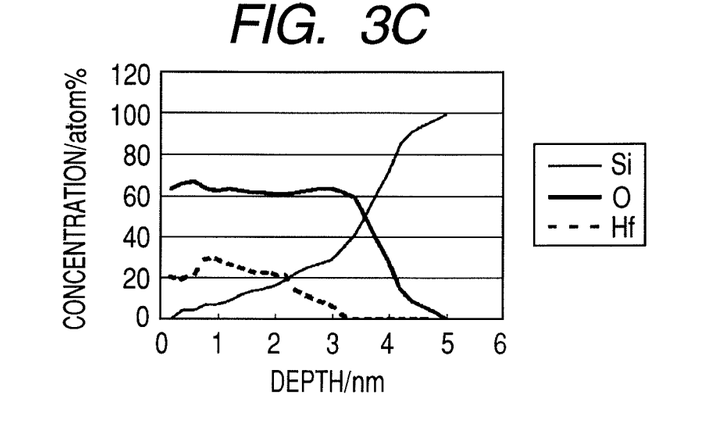

The distributions of the elements in the film thickness direction (depth direction) in the insulating film of the test sample piece were measured by RBS. FIGS. 3A to 3C show the measured distributions in the depth direction in the test sample pieces treated under the above conditions. As shown in FIGS. 3A to 3C, the distribution of Hf atoms was varied in the depth direction by changing the heating conditions. The conditions of the heating such as the heating temperature and the heating time can be selected suitably in accordance with the silicon dioxide film thickness, the sputtered metal film thickness, the material of the metal film, and so forth, not limited to the conditions shown in this Example.

EXAMPLE 1-4

The process of this Example is conducted as illustrated in FIGS. 1A to 1E. Silicon substrate 101 used was a P-type monocrystalline silicon substrate of 200 mm diameter.

In this Example, silicon dioxide film 102 in the surface layer of substrate 101 was formed in a thickness of 1.4 nm, and metal film 103 was formed by sputtering in a thickness of 0.8 nm. The films were formed and treated through the steps to the radical oxidation in the same manner as in Example 1-1 except that the temperature and time of the heat treatment after the metal film formation were changed to 600° C.

On the obtained test sample piece, an electrode was formed from Au, and the electric properties of C-V and I-V were evaluated. As the results, the oxide-equivalent film thickness was 1.61 nm, the flat band voltage (V fb) was 0.33 V, and the C-V curve hysteresis was 40 mV. The leakage current was $6.6 \times 10^{-5}$ A/cm$^2$ (Vg=V fb−1 V) satisfactorily.

EXAMPLE 1-5

The process of this Example is conducted as illustrated in FIGS. 1A to 1E. Silicon substrate 101 used was a P-type monocrystalline silicon substrate of 200 mm diameter.

The substrate was treated through steps to the radical oxidation in the same manner as in Example 1-4.

Then, the substrate having the films was treated for nitridation for 30 seconds in a plasma equipment which generates nitrogen radicals (not shown in the drawing). After the plasma nitridation, the films on the substrate were annealed at 1000° C. for 5 seconds in a nitrogen atmosphere. After the annealing, a Au electrode was formed thereon, and the electric properties of C-V and I-V were evaluated. As the results, the oxide-equivalent film thickness was 1.67 nm, the flat band voltage was 0.25 V (V fb), and the C-V curve hysteresis was 55 mV. The leakage current was $1.4 \times 10^{-5}$ A/cm$^2$ (Vg=V fb−1 V) satisfactorily.

(Second Invention)

A first embodiment of the process for forming an insulating film according to the second invention is described in detail with reference to FIGS. 5A to 5E.

Figure 5A:
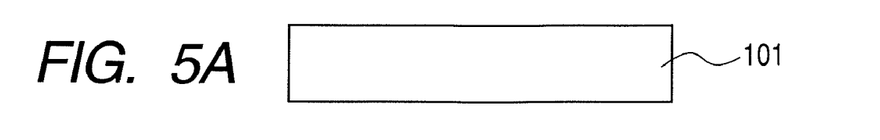
FIGS. 5A, 5B, 5C, 5D, and 5E are sectional views illustrating an embodiment of production of dielectric films according to the present second invention.
Figure 5B:
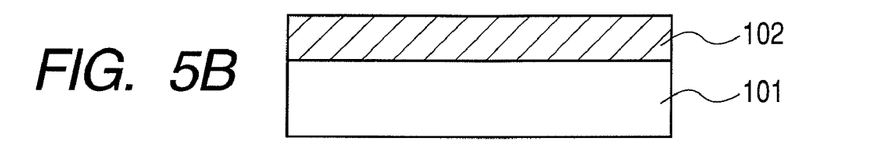
Figure 5C:
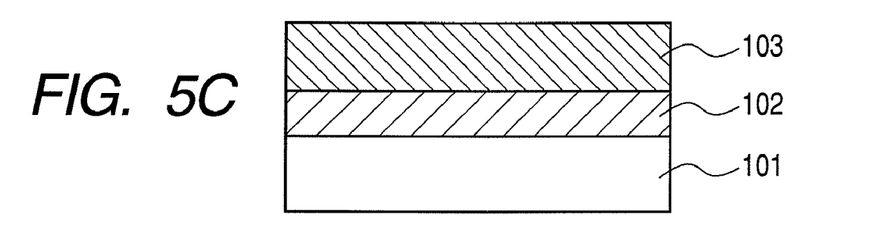

In FIGS. 5A to 5E, the numerals denote the followings: 101, a silicon substrate (occasionally called simply as a "substrate"); 102, a silicon dioxide film; 103, a metal film; 104, a metal silicate film; 105, a metal dioxide film. The steps illustrated by FIGS. 5A to 5C are the same as the steps illustrated in FIGS. 1A to 1C. Therefore the description thereof is omitted.

Figure 5D:
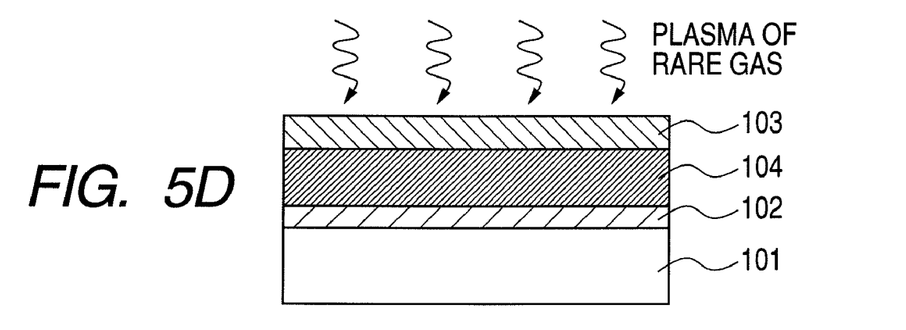

After the steps of FIGS. 5A to 5C, as illustrated in FIG. 5D, a third step is conducted in which the metal atoms constituting metal film 103 are forced to diffuse into silicon dioxide film 102 by exposing metal film 103 to rare gas plasma in an atmosphere in which the metal atoms are not oxidized (non-oxidizing atmosphere). To obtain the non-oxidizing atmosphere, for example, the chamber for the plasma treatment is evacuated to an ultra-high vacuum to eliminate oxygen, moisture, and other substances before the plasma exposure to prevent oxidation of metal film 103; or otherwise the atmosphere in the treatment chamber is substituted sufficiently by a rare gas.

The non-oxidizing atmosphere in the third step in the present invention signifies an atmosphere in which metal film 103 is not oxidized. The non-oxidizing atmosphere in this third step is preferably constituted of at least one of the rare gases of He, Ne, Ar, Kr, and Xe. The oxygen partial pressure in the non-oxidizing atmosphere in this third step is preferably not higher than $1 \times 10^{-5}$ Pa.

The rare gas plasma contains preferably a rare gas having an atomic weight approximate to that of the metal atom constituting metal film 103 as described later. For example, for metal film 103 containing at least Zr, the rare gas contains preferably Kr at least; and for metal film 103 containing at least Hf, the rare gas contains preferably Xe at least.

The rare gas atoms, which are extremely stable, will not react with the metal atoms constituting metal film 103 exposed to the rare gas plasma. On introducing the rare gas plasma onto the surface of metal film 103, the rare gas atoms collide against the metal atoms constituting the metal film 103. By this collision, a part of the kinetic energy of the rare gas atoms introduced onto metal film 103 is converted to the kinetic energy of the metal atoms to cause a so-called recoil phenomenon (knock-on) to thrust the metal atoms into the adjacent film. Thereby, the metal atoms diffuse into silicon dioxide film 102 under metal film 103. The efficiency of the knock-on for converting the kinetic energy of the rare gas atoms to that of the metal atoms is higher when the atomic weights of the metal atoms and the rare gas atoms are nearer. For example, for metal film 103 composed of Zr, is suitable a rare gas containing at least Kr having an atomic weight nearest to Zr. For metal film 103 composed of Hf, is suitable a rare gas containing at least Xe having an atomic weight nearest to Hf. For metal film 103 containing Zr and Hf, is suitable a gas containing at least Kr and Xe. In this second invention, the metal film is formed by deposition of a metal in an unreacted metal atom state in non-oxidizing atmosphere, so that the chemical bonding between metal atoms is extremely weak. Therefore, the metal atoms are readily recoiled even by a relatively low kinetic energy of the rare gas atoms introduced to metal film 103.

A part of the metal atoms are thrusted deep into the film and impelled into silicon dioxide film 102 under metal film 103. In such a manner, metal film 103 and silicon dioxide film 102 are mixed to form metal silicate film 104. A conventional radical oxidation after the deposition of the metal film on the silicon dioxide film causes less diffusion of the metal atoms, causing hardly the mixing of the metal film and the silicon dioxide film, causing hardly formation of the metal silicate film. On the other hand, in the present invention, the metal atoms are knocked on efficiently to mix well metal film 103 with silicon dioxide film 102, forming readily metal silicate film 104. Metal silicate film 104 thus formed gives a high permittivity dielectric films having excellent thermal stability in comparison with metal dioxide film 103.

In the present invention, the incident flux or incident energy of the rare gas atoms can be selected suitably for controlling the concentration distribution of the metal atoms diffusing into the film by knocking-on in the depth direction. The incident flux of the rare gas atoms can be controlled, for example, by changing the plasma density by adjusting the high-frequency power applied for plasma generation. The incident energy of the rare gas atoms can be controlled by applying a bias to the supporting table of substrate 101. In the present invention, the method of controlling the incident flux or incident energy of the rare gas atoms is not limited to the methods mentioned above.

In the present invention, the rare gas for efficient knock-on of the metal atoms includes Ar, Kr, and Xe. Further, the gas for diluting the rare gas includes He, Ne, Ar, Kr, and Xe, and a mixture thereof.

Figure 5E:
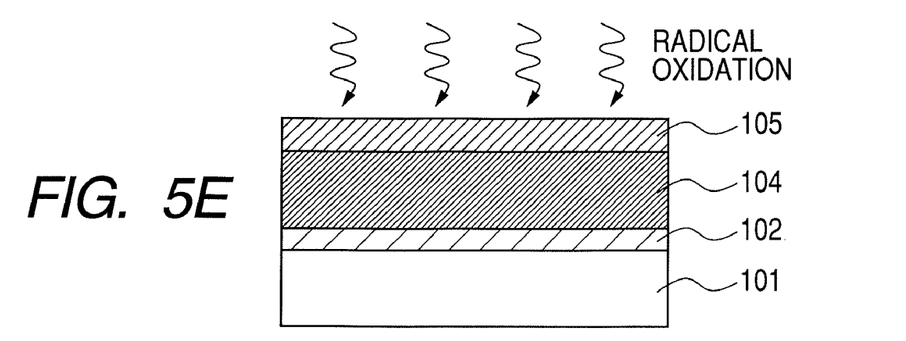

The fourth step of this second invention, illustrated in FIG. 5E is the same as the fourth step (FIG. 1E) of the first invention, Therefore the description thereof is omitted. If necessary, the fifth step is conducted for nitridation treatment after the fourth step similarly.

As described above, the step of diffusion of the metal atoms and the step of oxidation of the metal film are conducted separately. Thereby, the conditions of diffusion of metal atoms and the conditions of oxidation of the metal film can be controlled independently, and further the diffusion of the metal atoms can be conducted by knock-on as described above efficiently with a relatively low energy. Thus high permittivity dielectric films suitable as high permittivity gate dielectric films can be formed with precise controllability and high productivity.

Next, the second embodiment of the process for production of the dielectric films according to the second invention is described below with reference to FIG. 6A and FIG. 6B.

Figure 6A:
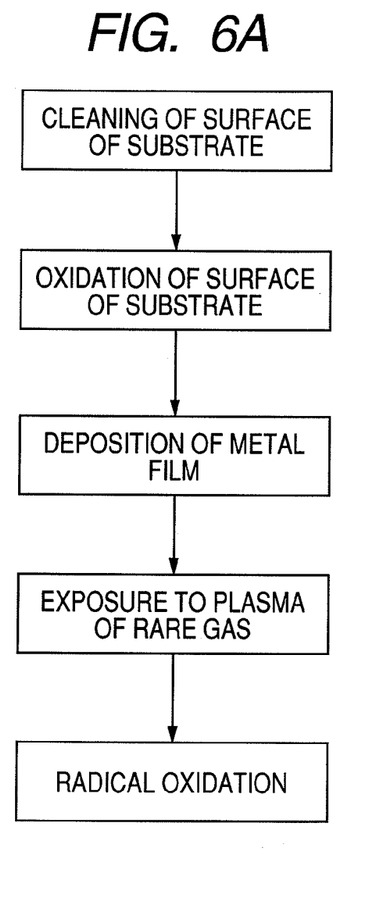
FIGS. 6A and 6B are process charts for describing the first and second embodiment of dielectric films according the second invention.

FIG. 6A is a flow chart of the processing steps in the first embodiment. In the chart, the step of "oxidation of surface of substrate" corresponds to the above-mentioned first step; the step of "deposition of metal film" corresponds to the above-mentioned second step; the step of "exposure to rare gas plasma" corresponds to the above third step; and the step of "radical oxidation" corresponds to the above-mentioned fourth step.

Figure 6B:
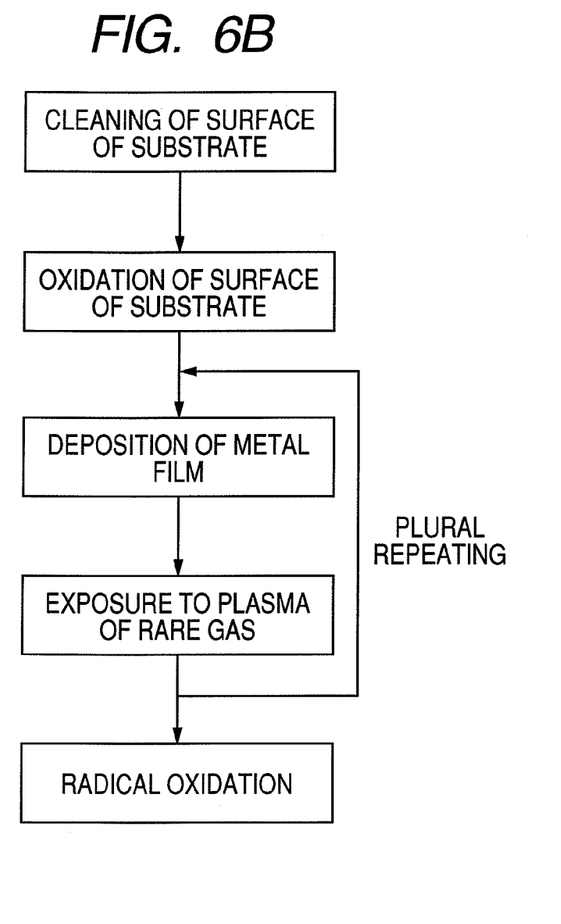

FIG. 6B is a flow chart of the processing steps of the second embodiment in comparison with the first embodiment. In the second embodiment, after the first step, the second step and the third step are alternately repeated plural times, and thereafter the fourth step is conducted. That is, the steps of "deposition of metal film" and "exposure to rare gas plasma" are alternately repeated with the other steps are being the same as in the first embodiment.

In the first embodiment, after the deposition of metal film 103, the metal atoms are thrusted deep into the adjacent film by knock-on by the rare gas atoms in exposure to the rare gas plasma. However, when metal film 103 has a thickness larger than the average movement distance of the metal atoms by the knock-on, the most of the knocked-on metal atoms near the surface of metal film 103 can be stopped within the film even if the metal atoms are thrusted inward. In this state, metal film 103 and silicon dioxide film 102 can not be mixed sufficiently. For sufficient mixing, in this embodiment, metal film 103 is deposited in a thickness smaller than the average knock-on movement distance of the metal atoms, and the metal film is exposed to the rare gas plasma to facilitate the movement of the metal atoms into underlying silicon dioxide film 102. These steps are repeated to improve the mixing of the silicon dioxide film and the metal film in comparison with the deposition of the metal film once in a large thickness and exposure of the thick metal film to the rare gas plasma without the repetition.

This embodiment is especially effective when the incident energy of the rare gas plasma cannot readily be controlled as in the first embodiment. For example, higher incident energy can cause a defect in the film, but this embodiment prevents the formation of such a defect. Further, the mixing can be promoted without a bias applying means for controlling the incident energy. Thus, this embodiment has effects, in addition to the effect of the first embodiment, of promoting the mixing of metal film 103 and silicone dioxide film 102 even in the structure in which the mixing is difficult.

(Third Invention)

Another embodiment of formation of the insulating film according to the present third invention is described below in detail with reference to FIGS. 7A to 7D.

Figure 7A:
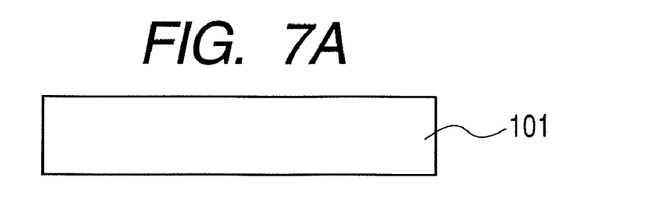
FIGS. 7A, 7B, 7C, and 7D are sectional views illustrating an embodiment of production of dielectric films according to the present third invention.
Figure 7B:
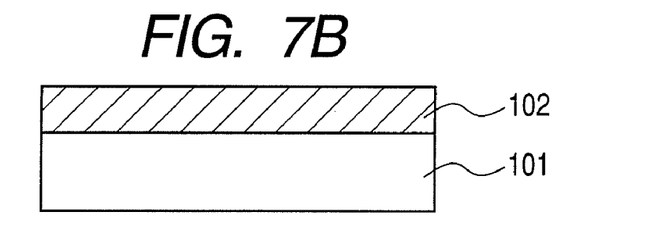
Figure 7C:
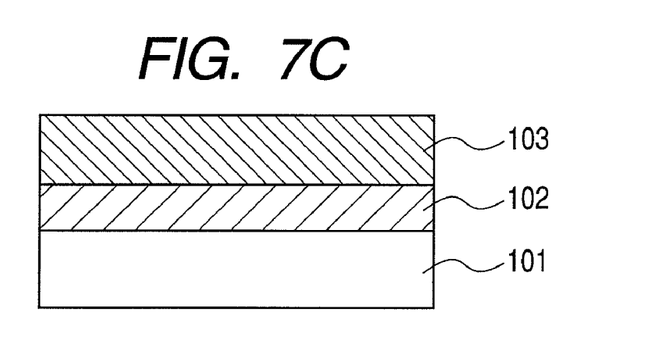

In this embodiment, the steps to the formation of metal film 103 as illustrate in FIGS. 7A to 7C are the same as in the first embodiment of the second invention.

Figure 7D:
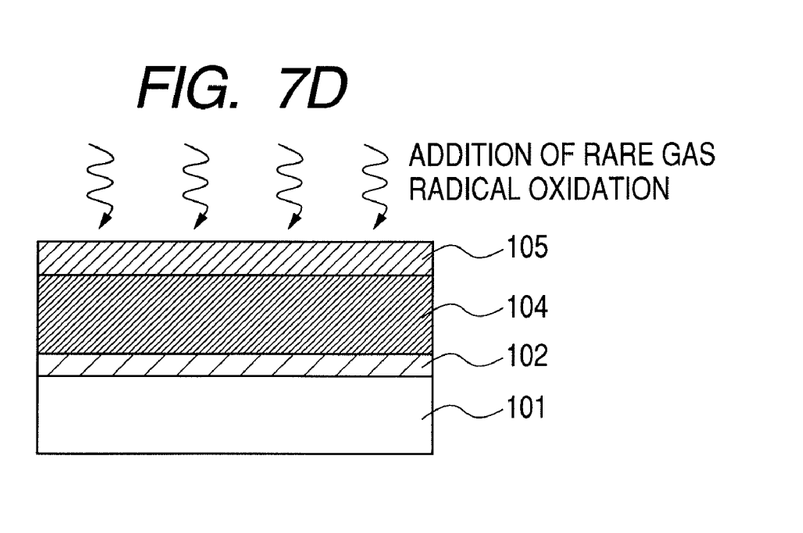

Next, a third step is conducted as illustrated in FIG. 7D. In this step, metal film 103 is exposed to plasma containing an oxidizing gas and a rare gas to oxidize metal film 103 and to diffuse the metal atom of metal film 103 into silicon dioxide film 102. In this step, the gas used in plasma oxidation contains, in addition to the oxygen-containing oxidizing gas, at least a rare gas having the atomic weight nearest to the atomic weight of the atoms constituting the metal film. Thereby the oxidation of the metal film and the mixing of the metal atoms of the metal film by knock-on with the underlying silicon dioxide film are conducted simultaneously, enabling curtailment of the processing steps of the dielectric films formation. Further, in this third invention, the velocity of oxidation of the metal film and diffusion of the metal atoms by the knock-on are controlled by changing the mixing ratio of the oxidizing gas to the rare gas. For example, plasma is generated by use of a gas containing a small amount of oxygen and a large amount of a rare gas having an atomic weight nearest to the atomic weight of the metal-film-constituting atoms, and the metal film is exposed thereto. With such a gas mixture, the oxidation velocity of the metal film by the oxygen radicals in the plasma is relatively low, and during the oxidation the metal atoms continues to diffuse into the underlying oxide film by knock-on by the rare gas atoms. Therefore, an intended film structure can be obtained by controlling the metal film oxidation velocity and the metal atom diffusion by changing the mixing ratio of the oxidizing gas to the rare gas.

As described above, according to the third invention, the high permittivity dielectric films having a thermal stability suitable for high permittivity gate dielectric films can be produced by a simple process with precise controllability and high productivity.

EXAMPLES

The process of formation of the dielectric films according to the second invention and the third invention are described specifically with reference to examples without limiting the invention thereto.

EXAMPLE 2-1

The process of this Example is conducted according to an embodiment of the second invention as illustrated in FIGS. 5A to 5E. Silicon substrate 101 was a p-type monocrystalline silicon substrate of 200 mm diameter.

Firstly, the surface of substrate 101 was cleaned by RCA cleaning to eliminate impurities and native oxide film.

Next, substrate 101 was delivered into a high-speed thermal oxidation equipment and was thermally oxidized in an oxygen atmosphere at 1000° C. to form silicon dioxide film 102 of 1.4 nm thick as the surface layer of substrate 101.

Subsequently, substrate 101 having silicon dioxide film 102 was transferred into an RF-magnetron type sputtering equipment not shown in the drawing. The target of the sputtering equipment was composed of Zr. The sputtering equipment holding the substrate inside was evacuated to a vacuum of $2\times10^{-6}$ Pa. Substrate 101 was heated by a heating means and was kept at 300° C. Thus oxygen and moisture which can oxidize the metal film deposition was evacuated out of the sputtering equipment. Then Ar gas was introduced into the sputtering equipment at a rate of 5 sccm, and the inside pressure of the sputtering equipment was kept at 0.2 Pa. Then a high frequency wave of 250 W was applied to the target to generate plasma to sputter the Zr atoms constituting the target. The sputtered Zr atoms flied to substrate 101 opposing to the target and deposit on silicon dioxide film 102 to form metal film 103. By this treatment, metal film 103 composed of Zr was formed in a thickness of 1.2 nm on silicon dioxide film 102. During this metal film formation, the oxygen pressure was kept in the range from $1\times10^{-7}$ to $10^{-8}$ Pa.

Thereafter, substrate 101 with films 102, 103 was transferred into a surface-wave plasma equipment (not shown in the drawing) through a high vacuum space containing an extremely small amount of residual oxygen to avoid oxidation of the Zr film deposited in the preceding step. The plasma equipment was evacuated, and a rare gas was introduced into the plasma equipment at a flow rate of 1000 sccm. Kr is selected as the rare gas which has the atomic weight closest to Zr. The pressure inside the plasma equipment was kept at 67 Pa. In this step, the temperature of substrate 101 was kept at 200° C. by a heater incorporated in a substrate-supporting stage. A microwave of 2.45 GHz was emitted from an antenna (not shown in the drawing), and was introduced into the plasma equipment through a dielectric wall for keeping the vacuum to generate surface-wave plasma. The surface of metal film 103 was exposed to this excited Kr plasma for 30 seconds to thrust the Zr atoms into the film by knock-on of Zr introduced to metal film 103. Thereby, Zr film 103 is mixed with the underlying silicon dioxide film 102 to form metal silicate film (Zr silicate film) 104. The oxygen partial pressure in the step of exposure of the surface of metal film 103 to the Kr plasma was controlled in the range from $1\times10^{-7}$ to $10^{-8}$ Pa.

Next, the plasma equipment was evacuated, and $O_2$ gas was introduced to the plasma equipment at a flow rate of 500 sccm, and the pressure in the plasma equipment was kept at 133 Pa. Then a microwave of 2.45 GHz was emitted from an antenna, and was introduced into the plasma equipment to generate surface-wave plasma. The surface of metal film 103 was exposed to this excited oxygen plasma for 10 seconds to conduct radical oxidation. Thereby, the metal film (Zr film) 103 remaining unsilicated was oxidized, and oxygen-lacking silicate film 104 was sufficiently oxidized.

The distributions of the elements constituting the insulating film in the film thickness direction (depth direction) were measured by high-resolution RBS. Comparative samples were prepared and measured in the same manner as above: one oxidized without the exposure of the metal film to the Kr plasma after the metal film deposition, and the other exposed to He plasma in place of the Kr plasma.

Figure 8A:
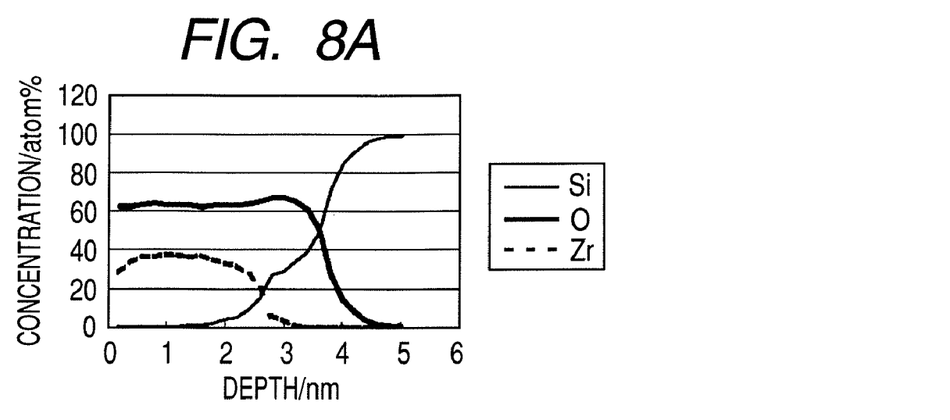
FIGS. 8A, 8B, and 8C show distributions in the depth direction of the elements constituting the dielectric films formed under different conditions for rare gas plasma exposure.
Figure 8B:
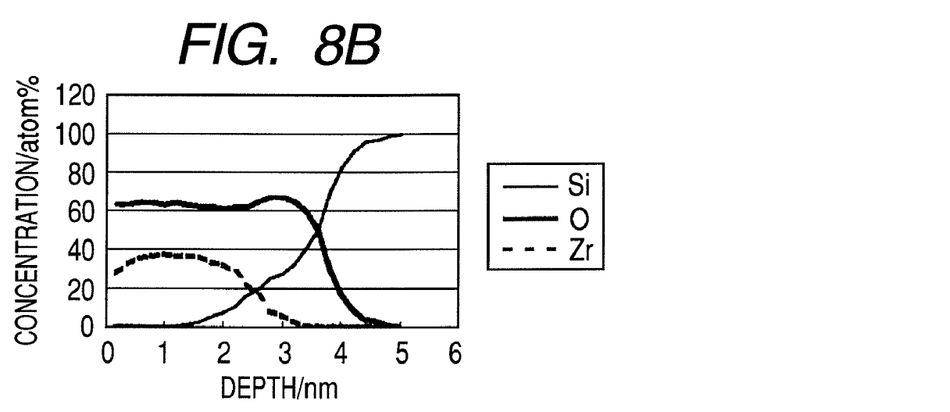
Figure 8C:
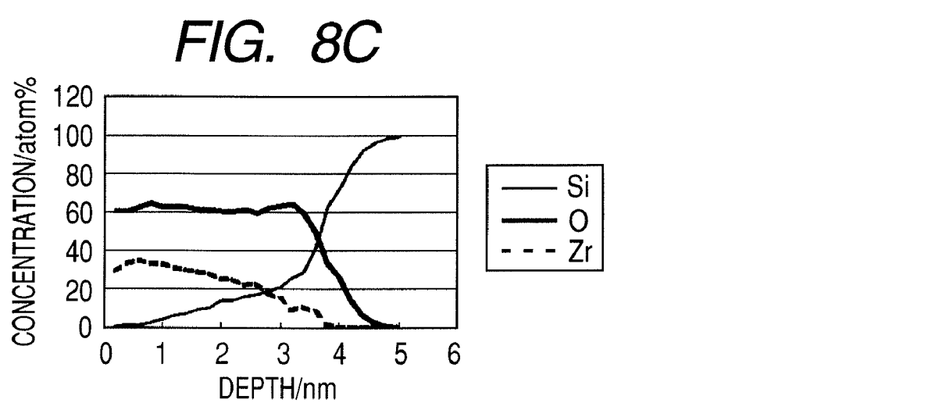

FIG. 8A shows concentration profiles in the depth direction in the comparative sample which was not exposed to the Kr plasma. FIG. 8B shows concentration profiles in the depth direction in the comparative sample which was exposed to the He plasma. FIG. 8C shows the concentration profile in the depth direction in the sample of this Example of the present invention which was exposed to the Kr plasma. In the sample shown in FIG. 8A, which was not exposed to the rare gas plasma, the Zr oxide layer and the silicon dioxide layer are nearly separated. In the sample shown in FIG. 8B, which was exposed to He plasma, although some mixing is observed around the interface between the Zr oxide film and the silicone dioxide film, the two films are separated in almost the entire depth range. In contrast, in the sample shown in FIG. 8C, which was exposed to plasma of Kr having an atomic weight closest to the Zr atomic weight, the silicon dioxide film and the Zr oxide film are observed to be mixed. Further, these samples were annealed at 700° C. for 10 seconds and the cross sections were observed by TEM. As the result, in the samples shown in FIGS. 8A and 8B, fine crystals were found to be formed in the Zr oxide film, whereas in the sample shown in FIG. 8C, no crystal was found.

As described above, the mixing of the metal film with the silicon dioxide film was enhanced by exposure to rare gas plasma having an atomic weight close to that of the metal element of the metal film to form a thermally stable metal silicate film.

EXAMPLE 2-2

In this Example, an insulating film was formed in the same manner as in Example 2-1, except that the metal film was formed by deposition of Hf (thickness of deposited Hf film: 1 nm) in place of the deposition of Zr, and that the metal film was exposed to Xe which has an atomic weight closest to that of Hf (exposure time: 10 seconds) in place of exposure to Kr plasma.

Further, after the oxidation of the metal film, in the same plasma treatment equipment, the surface of metal dioxide film 105 was exposed to nitrogen plasma for 20 seconds for nitridation. Finally, the substrate was transferred to an RTA equipment, and was annealed at 1000□ for 5 seconds. The cross-section of the resulting dielectric films was observed by TEM. In spite of the temperature treatment at as high as 1000° C., no fine crystal was found to be formed in the film: the film had excellent thermal stability.

EXAMPLE 2-3

This Example was conducted according to the second invention through the steps shown in FIG. 6B.

Silicon dioxide film 102 was formed in a thickness of 2 nm on the surface layer portion of substrate 101 in the same manner as in Example 2-1.

On silicon dioxide film 102, Hf film 103 was formed by deposition of Hf in a thickness of 1 nm by means of a RF magnetron-sputtering equipment. The sputtering equipment was evacuated sufficiently to eliminate remaining oxygen and remaining moisture not to cause oxidation of Hf. In the formation of Hf film 103, the oxygen partial pressure was kept in the range from $1\times10^{-7}$ to $10^{-8}$ Pa.

Substrate 101 having films 102, 103 was transferred into a surface-wave plasma treatment equipment. The surface of Hf film 103 was exposed to plasma of Xe, having an atomic weight closest to that of Hf for 10 seconds at an oxygen partial pressure kept in the range from $1\times10^{-7}$ to $10^{-8}$ Pa.

Then, the step of forming a Hf film in a thickness of 1 nm by sputtering and the step of exposure of the Hf film to Xe plasma for 10 seconds are conducted again.

Next, the film was oxidized in the plasma treatment equipment in the same manner as in Example 2-1.

The resulting dielectric films were analyzed for the distributions of the element constituting the dielectric films in the film thickness direction (depth direction) by high-resolution RBS. Separately, a comparative sample was prepared by one-time deposition of Hf in a thickness of 2 nm and one-time exposure to Xe plasma for 20 seconds. This comparative sample was analyzed simultaneously.

Figure 9A:
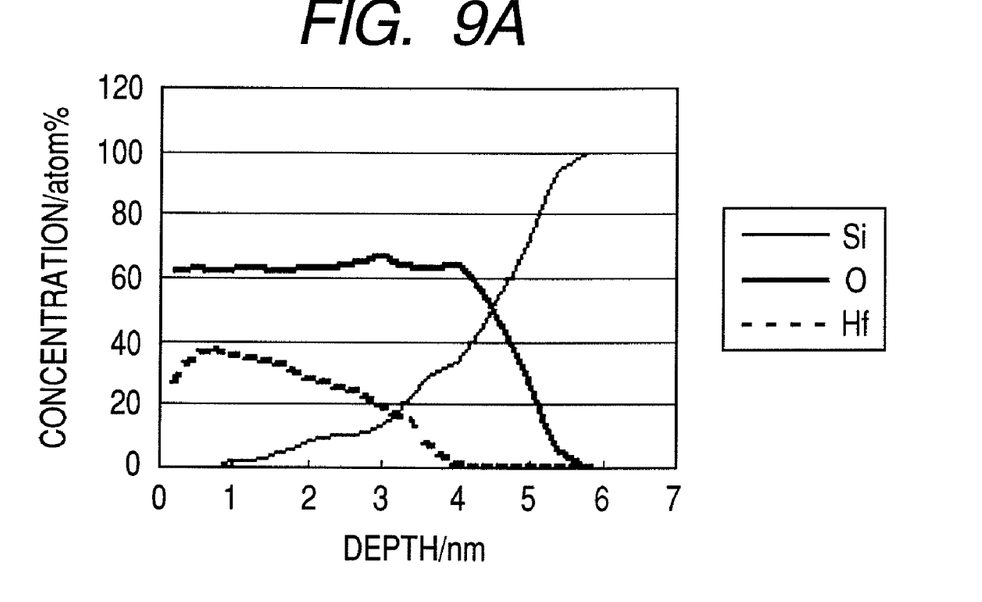
FIGS. 9A and 9B show distributions in the depth direction of the elements constituting the dielectric films formed under different conditions for rare gas plasma exposure.
Figure 9B:
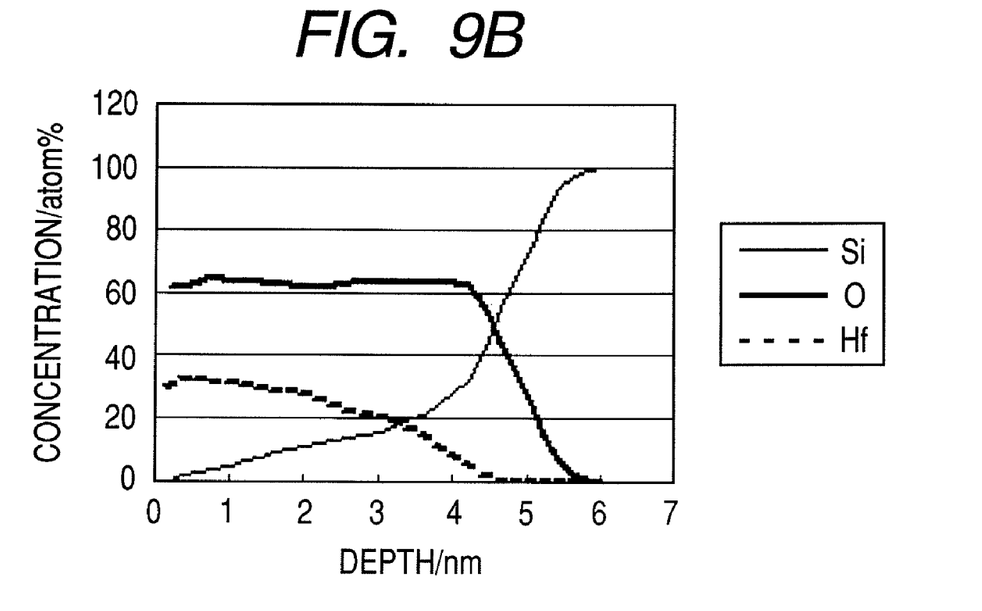

FIG. 9A shows atom concentration profiles in the film produced by one-time Hf deposition in a thickness of 2 nm and treatment by Xe plasma in the thickness direction. FIG. 9B shows atom concentration profiles in the dielectric films of Example of the present invention produced by two cycles of repetition of the deposition of Hf of 1-nm thick and the Xe plasma treatment.

The two samples are the same in the total thickness of the Hf deposition film, and in the total time of exposure to the rare gas plasma. However, in the sample shown in FIG. 9B which was treated for Hf deposition and Xe plasma exposure repeated in two cycles, Hf distributes deep in the underlying silicon dioxide film in comparison with the sample shown in FIG. 9A which was treated for one-time deposition of Hf in 2-nm thickness. Thus the mixing is promoted by repeating alternately the deposition of thin metal film and rare gas plasma exposure in comparison with one-time deposition of thick metal film and rare gas exposure.

EXAMPLE 2-4

In this Example, an electrode was formed on dielectric films, and electric properties of the film were evaluated.

The dielectric films were formed in the same manner as in Example 2-1 except the following points. The substrate was a P-type monocrystalline silicon plate of 200-mm diameter having a resistance of 0.1 Ω·cm. The silicon dioxide film was formed in a thickness of 1.4 nm. A Hf film was deposited thereon in a thickness of 0.8 nm. The deposited film was exposed to plasma composed of a Xe—He gas mixture for 10 seconds, and oxidized by oxygen plasma for 10 seconds to form dielectric films. Then the film was nitrided by nitrogen plasma for 30 seconds.

The formed dielectric films were annealed in a nitrogen atmosphere at 1000° C. for 5 seconds. After the annealing, a Au electrode was formed by vapor deposition. The C-V characteristics and the I-V characteristics were evaluated. As the results, the oxide-equivalent film thickness was 1.51 nm, the flat band voltage was 0.35 V (V fb), and the hysteresis of C-V curve was 50 mV. The leakage current was $1.4 \times 10^{-6}$ A/cm$^2$ (Vg=V fb−1 V) satisfactorily.

EXAMPLE 3-1

In this Example, the films were formed in the same manner as in the embodiment of the third invention as illustrated in FIGS. 7A to 7D.

The insulating film was formed in the same manner as in Example 2-3 except the following points. The substrate was a P-type monocrystalline silicon plate of 200-mm diameter having a resistance of 0.1 Ω·cm. After cleaning of the substrate, a silicon dioxide film was formed by thermal oxidation in a thickness of 1.8 nm. A Hf film was deposited thereon in a thickness of 0.5 nm. The deposited film was exposed to plasma composed of oxygen and a rare gas for 30 seconds to cause oxidation of the Hf film and mixing of the Hf film with the silicon dioxide film. The rare gas employed was Xe which has an atomic weight closest to that of Hf. The flow rate ratio of Xe to the entire gas was selected to be 10% and 90% to obtain two samples. The prepared samples were evaluated for distribution of the elements in the depth direction by a high-resolution RBS.

Figure 10A:
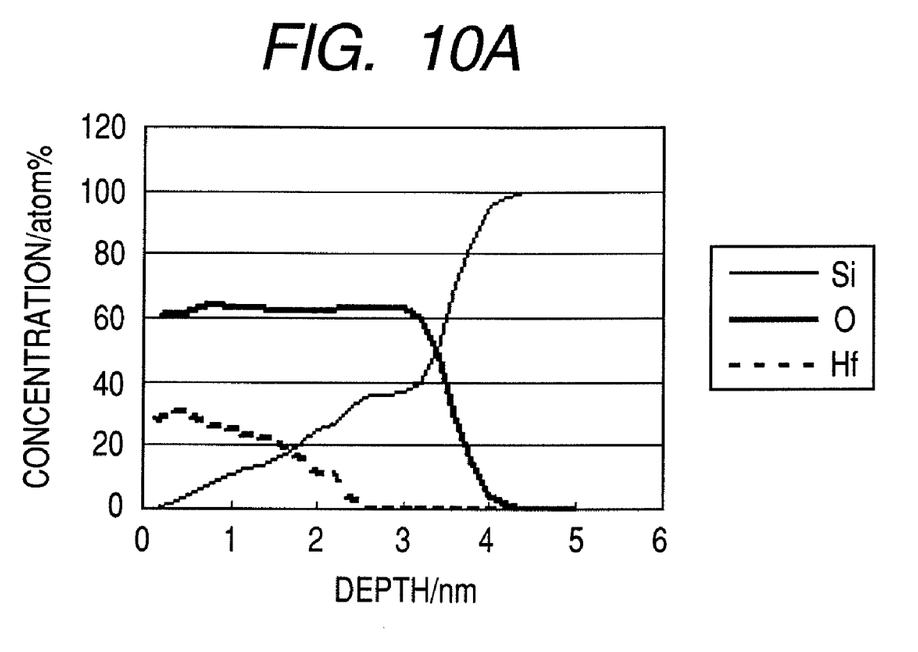
FIGS. 10A and 10B show distributions in the depth direction of the elements constituting the dielectric films formed by plasma oxidation with different mixing ratios of rare gases.
Figure 10B:
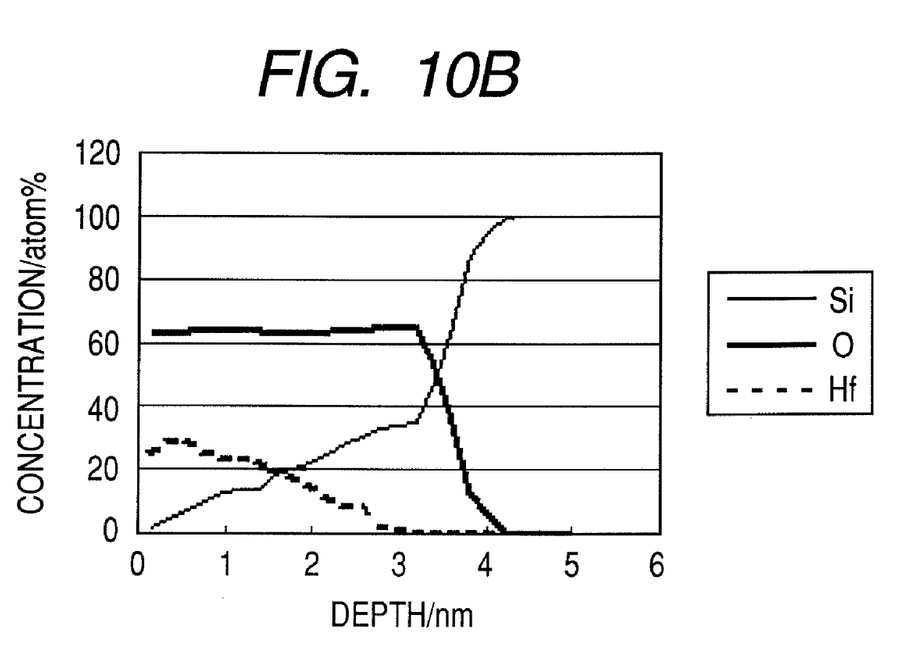

FIG. 10A shows the concentration profiles of the elements in the depth direction in the sample which was prepared at a Xe flow rate of ratio of 10%. FIG. 10B shows the concentration profile of the elements in the depth direction in the other sample which was prepared at a Xe flow rate ratio of 90%.

From FIG. 10A and FIG. 10B, the distribution of Hf concentration was changed by changing the flow rate ratio of Xe. In other examples also the distribution of the Hf concentration in the depth direction can be changed by changing the ratio of the oxygen to the rare gas in the oxidation.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2007-336732 filed on Dec. 27, 2007, and No. 2007-336733 filed on Dec. 27, 2007 which are hereby incorporated by reference herein their entirety.

What is claimed is:

1. A process for forming a dielectric film containing at least metal atoms, silicon atoms, and oxygen atoms on a silicon substrate, the process comprising:
   a first step of oxidizing a surface of the silicon substrate to form a silicon oxide film;
   a second step of forming a metal film on the silicon oxide film in a non-oxidizing atmosphere;
   a third step of exposing the metal film to rare gas plasma in a non-oxidizing atmosphere to diffuse the metal atoms constituting the metal film into the silicon oxide film; and
   a fourth step of oxidizing the silicon oxide film containing the diffused metal atoms to form the film containing the metal atoms, silicon atoms, and oxygen atoms.

2. The process for forming a dielectric film according to claim 1, wherein, after the first step, the second step and the third step are repeated alternately plural times, and thereafter the fourth step is conducted.

3. The process for forming a dielectric film according to claim 1, wherein the oxidation in the fourth step is conducted by radical oxidation.

4. The process for forming a dielectric film according to claim 1, wherein the rare gas plasma contains at least a rare gas having an atomic weight closest to the metal atom constituting the metal film.

5. The process for forming a dielectric film according to claim 4, wherein the metal film contains at least Zr, and the rare gas contains at least Kr.

6. The process for forming a dielectric film according to claim 4, wherein the metal film contains at least Hf, and the rare gas contains at least Xe.

7. The process for forming a dielectric film according to claim 1, wherein the process comprises, after the fourth step, additionally a fifth step in which the film containing the metal atoms, silicon atoms, and oxygen atoms is nitrided to form a metal nitride silicate film.

8. The process for forming a dielectric film according to claim 7, wherein the plasma containing at least nitrogen atoms is used as the means for nitriding the film in the fifth step.

* * * * *